US007129021B2

(12) United States Patent
Noglik et al.

(10) Patent No.: US 7,129,021 B2
(45) **Date of Patent: *Oct. 31, 2006**

(54) POLYMER SYSTEM WITH SWITCHABLE PHYSICAL PROPERTIES AND ITS USE IN DIRECT EXPOSURE PRINTING PLATES

(75) Inventors: Horst Noglik, Coquitlam (CA); Tibor Horvath, Vancouver (CA); Joyce Diana Dewi Djauhari Lukas, Coquitlam (CA); David A. Morgan, Stillwater, MI (US)

(73) Assignee: Creo SRL, St. James (BB)

( * ) Notice: Subject to any disclaimer, the term of this patent is extended or adjusted under 35 U.S.C. 154(b) by 0 days.

This patent is subject to a terminal disclaimer.

(21) Appl. No.: 10/647,905

(22) Filed: Aug. 25, 2003

(65) Prior Publication Data

US 2004/0081911 A1 Apr. 29, 2004

Related U.S. Application Data

(63) Continuation-in-part of application No. 10/338,128, filed on Jan. 6, 2003, which is a continuation-in-part of application No. 09/465,658, filed on Dec. 17, 1999, now Pat. No. 6,503,691.

(51) Int. Cl.
*G03C 1/76* (2006.01)
*G03F 7/038* (2006.01)
*G03F 7/11* (2006.01)
*G03F 7/20* (2006.01)

(52) U.S. Cl. .............................. 430/273.1; 430/271.1; 430/302; 430/944; 430/945

(58) Field of Classification Search ............. 430/273.1, 430/271.1, 270.1, 302, 906, 910, 908, 944, 430/945, 286.1, 287.1, 280.1, 284.1
See application file for complete search history.

(56) References Cited

U.S. PATENT DOCUMENTS 4,927,737 A 5/1990 Walls et al.
5,273,862 A 12/1993 Zertani et al.
5,286,594 A 2/1994 Sypek et al.
5,340,681 A 8/1994 Sypek et al.
5,597,677 A 1/1997 Kangas et al.
5,677,108 A 10/1997 Chia et al.
5,677,110 A 10/1997 Chia et al.
5,786,127 A 7/1998 Madoux et al.
5,972,556 A * 10/1999 Leenders .................... 430/200
5,997,993 A 12/1999 Bi et al.
6,051,366 A 4/2000 Baumann et al.
6,132,822 A * 10/2000 Overcash et al. .......... 428/34.2
6,171,748 B1 1/2001 Tanaka et al.
6,238,838 B1 5/2001 Gaschler et al.
6,352,819 B1 3/2002 Kenney et al.
6,387,595 B1 5/2002 Teng
6,397,749 B1 6/2002 Kita et al.
6,420,089 B1 7/2002 Baumann et al.
6,468,717 B1 10/2002 Kita et al.
6,495,310 B1 12/2002 Teng
6,503,684 B1 1/2003 Vermeersch et al.
6,503,691 B1 * 1/2003 Goodin et al. ........... 430/278.1
6,513,433 B1 2/2003 Inoue et al.
6,576,397 B1 6/2003 Kita et al.
6,576,401 B1 6/2003 Teng
6,593,057 B1 7/2003 Kita
6,596,455 B1 7/2003 Yanaka et al.
6,777,156 B1 * 8/2004 Goto et al. .............. 430/270.1

FOREIGN PATENT DOCUMENTS

| | | |
|---|---|---|
| EP | 1072402 | 1/2001 |
| EP | 1136256 | 9/2001 |
| EP | 0917544 | 12/2002 |
| EP | 1000387 | 11/2003 |
| JP | 11070756 | 3/1999 |
| WO | WO-98/13394 | 4/1998 |
| WO | WO-99/06890 | 2/1999 |
| WO | WO-99/41077 | 8/1999 |
| WO | WO-01/81008 | 11/2001 |

* cited by examiner

*Primary Examiner*—Sin Lee

(57) ABSTRACT

Polymer materials are described that undergo a two-level three-dimensional crosslinking process. During this process, hydrophilic polymers are crosslinked at two levels, the first results in a low level of crosslinking which leads to a toughening of the layer preventing dissolution by the fountain solution but with the layer remaining hydrophilic. The second level of crosslinking is higher and is the result of exposure to a laser diode thermal imaging device. The crosslinking at this second level results in a loss of hydrophilicity and provides instead an oleophilic image capable of accepting and transferring oil-based ink. The polymer materials are particularly useful in lithographic printing systems where they may used in articles such as a printing plate comprising a substrate having coated thereon a layer that becomes less hydrophilic upon exposure to thermal energy (e.g., heat applied by a laser, other collimated light, or thermal printhead) that effects crosslinking (initial crosslinking or increased crosslinking) in the layer, the layer comprising a mixture of a crosslinked polymer and a thermally active crosslinking metal compound. The invention also provides an overcoat layer eluable in aqueous media for a printing plate precursor comprising on a substrate a layer comprising a mixture of a crosslinked polymer and a thermally active crosslinking metal compound. The overcoat layer protects the heat-sensitive crosslinked polymer layer from discoloration, contamination and scratching and reduces odor and particulate emissions.

16 Claims, No Drawings

POLYMER SYSTEM WITH SWITCHABLE PHYSICAL PROPERTIES AND ITS USE IN DIRECT EXPOSURE PRINTING PLATES

CROSS-REFERENCE TO RELATED APPLICATIONS

This application is a continuation-in-part of U.S. patent application Ser. No. 10/338,128, filed Jan. 6, 2003, which is itself a continuation-in-part of U.S. patent application Ser. No. 09/465,658, filed Dec. 17, 1999, now issued as U.S. Pat. No. 6,503,691.

FIELD OF THE INVENTION

The present invention relates to polymeric compositions, particularly thermally sensitive polymeric mixtures with metal compounds that are also polymerizably sensitive, more particularly with thermosensitive compositions and elements comprising at least one layer of the thermosensitive composition that is capable of being imaged by a laser for lithographic printing, the resulting printable image showing printing durability and not requiring a wash-off processing step.

BACKGROUND OF THE INVENTION

The art of lithographic printing is based on the immiscibility of oil and water, wherein water or fountain solution is preferentially retained by either the imaged area or the non-imaged area, and the oily substance or ink does not adhere to the water, but instead only to those areas where no water or fountain solution is present. Commonly the ink is transferred to an intermediate material called a blanket, which in turn transfers the ink to the surface of the material upon which the image is to be reproduced.

A widely used type of lithographic printing plate has a light (UV) sensitive coating applied to an aluminum base support. The coating may respond to the light by having the portion that is exposed becoming soluble and removed by a subsequent development process. Such a plate is said to be a positive working plate. Conversely, when the area that is exposed becomes hardened or polymerized the plate is referred to as a negative working plate. In both instances the image areas are ink-receptive or oleophilic. The background or hydrophilic area is typically aluminum, which has been grained and anodized to provide a hydrophilic surface.

Direct digital imaging of offset printing plates (computer to plate CTP) is a technology that has assumed importance to the printing industry. In the use of this plate material, graphic information made by computer typesetting and desktop publishing is directly printed onto a plate by using a laser without an intermediate transfer material (film). The CTP process enables the rationalization and shortening of the platemaking process as well as a reduction in material costs. Advances in solid-state laser technology have made high powered diode lasers emitting energy at about 830 nm attractive light sources for carrying out this direct process. At least two printing technologies have been introduced that can be imaged with laser. Plates that can be imaged in this way are commercially sold by all of the major printing plate manufacturers. These materials require a development step to produce the final image.

A further printing technology is described for example in EP-A-0 573 091, U.S. Pat. Nos. 5,353,705 and 5,379,698. This technology does not require a development step, but instead relies on ablation to physically remove the imaged areas from the plate. Ablation requires high laser energy and power, resulting in low throughput and problems with debris after imaging.

Direct digital imaging without the use of a development step has been disclosed in U.S. Pat. No. 5,569,573 as a thermosensitive lithographic printing original plate comprising a substrate, a hydrophilic layer containing a hydrophilic binder polymer, and a microcapsuled oleophilic material which forms an image area by heating; the hydrophilic binder polymer having a three-dimensional cross-link and a functional group which chemically combines with the oleophilic material in the microcapsule when the microcapsule is decomposed, and the microcapsuled oleophilic material having a functional group which chemically combines with the hydrophilic binder polymer when the microcapsule is decomposed. Development is not required in the platemaking process so that there are no problems with waste treatment and the like.

Sulfamides have found utility in photosensitive media primarily as peripheral addenda, rather than as active ingredients in the photosensitive process. For example, U.S. Pat. No. 5,360,700 teaches the use of sulfamides as antifungal agents in silver halide solutions. This patent asserts that for the improved liquid preservability, it is preferable to add an antifungal agent to the stabilizing solution which is used instead of water washing. The antifungal agents which can be preferably used are salicylic acid, sorbic acid, dehydroacetic acid, hydroxybenzoic acid compounds, alkylphenol compounds, thiazole compounds, pyridine compounds, guanidine compounds, carbamate compounds, morpholine compounds, quaternary phosphonium compounds, ammonium compounds, urea compounds, isoxazole compounds, propanolamine compounds, sulfamide derivatives and amino acid compounds. Some of the preferred thiazole compounds include 1,2-benzisothiazolin-3-one, 2-methyl-4-isothiazolin-3-one and 5-chloro-2-methyl-4-isothiazolinone. The sulfamide derivatives include fluorinated sulfamide, 4-chloro-3,5-dinitrobenzenesulfamide, sulfanylamide, acetosulfamine, sulfapyridine, sulfaguanidine, sulfathiazole, sulfadiazine, sulfamerazine, sulfamethazine, sulfaisoxazole, homosulfamine, sulfisomidine, sulfaguanidine, sulfamethizole, sulfapyradine, phthalisosulfathiazole and succinylsulfathiazole.

Silver sulfadiazine has been used in a wide array of applications in the pharmaceutical environment, mostly for its antimicrobial properties. It is stable, insoluble in water, alcohol and ether and does not appear to stain or darken like other silver salts, such as silver nitrate. The applicants are, however, unaware of the use of silver salts of sulfadiazine and sulfamerazine for purposes other than direct or indirect antimicrobial activity or other medical purposes.

Polymers and metal salts or metal compounds have been combined for many various reasons, usually with the metal salts or metal compounds as fillers or compositing agents.

U.S. Pat. No. 5,948,599 describes a method of forming an image in a printing plate comprising the steps: (a) providing a radiation sensitive printing plate comprising a substrate coated with: (i) a coating comprising (1) a disperse water-insoluble heat-softenable phase A, and (2) a continuous binder phase B that is soluble or swellable in an aqueous medium; at least one of disperse phase A or continuous phase B having a reactive grouping, or precursor therefore, such that insolubilization of said coating occurs at elevated temperature and/or on exposure to actinic radiation, and (ii) a substance capable of strongly absorbing radiation and transferring the energy thus obtained as heat to the disperse phase so that at least partial coalescence of the coating occurs;

(b) image-wise exposing the radiation sensitive plate to a beam of high intensity radiation, by directing the radiation at sequential areas of the coating and modulating the radiation so that the particles in the coating are selectively at least partially coalesced; developing the image-wise exposed plate with aqueous medium to selectively remove the areas containing the non-coalesced particles and leave an image on the substrate resulting from the at least partially coalesced particles; and (c) heating the developed plate and/or subjecting it to actinic radiation to effect rapid reaction of said reactive grouping and insolubilization of said image.

U.S. Pat. No. 5,840,469 discloses a thermographic element comprising a support having coated thereon a thermographic emulsion comprising: (a) a light insensitive silver salt (for example, silver salt of a carboxylic acid having 4 to 30 carbon atoms, silver benzoates, silver salts of compounds having mercapto or thione groups such as silver 3-mercapto-4-phenyl-1,2,4-triazolate, silver salts of thioglycolic acid and dicarboxylic acids, silver salts of benzotriazoles or imadazoles, and the like); a gallic acid reducing agent; and an infrared absorbing compound. Polymeric binders are also useful in forming the layer (as shown in column 5, lines 2–16). The system provides a change in optical density because of the thermally induced reduction of silver ion to form silver metal when the system is exposed to infrared radiation.

U.S. Pat. No. 6,352,819 describes high contrast thermographic and photothermographic materials comprising a barrier layer to prevent migration of diffusible by-products resulting from high temperature development. The barrier layer comprises a film-forming polymer(s) that reacts with or acts as a physical barrier to diffusible by-products resulting from development.

Lithographic printing plates based on free-radical initiated polymerization/curing mechanisms are known to be susceptible to quenching by oxygen. A method useful for preventing oxygen quenching of radiation-generated free radicals is to overcoat the photosensitive coating of a printing plate with a water-soluble polymeric resin. See for example U.S. Pat. No. 5,786,127, U.S. Pat. No. 5,340,681, U.S. Pat. No. 5,286,594, U.S. Pat. No. 5,273,862, U.S. Pat. No. 4,927,737, U.S. Pat. No. 6,051,366, EP 1,000,387 and EP 0 917 544.

U.S. Pat. No. 5,677,108, U.S. Pat. No. 5,677,110 and U.S. Pat. No. 5,997,993 disclose an on-press developable lithographic printing plate precursor comprising a lithographic hydrophilic printing plate substrate, a photohardenable photoresist, and a layer of polymeric protective overcoat. The overcoat functions as an oxygen barrier, as well as imparting the plate with a non-tacky surface and an enhanced resistance to the adverse influence of ambient humidity. The overcoat contains a polyphosphate salt and may further contain a fountain soluble or dispersible crystalline compound to facilitate on-press removability.

Heat-sensitive lithographic printing plates not requiring a wet development step after exposure have been desired by the industry for a long time. One approach to no-process lithographic printing plates relies on ablation to physically remove the imaging layer from the printing plate precursor. Unfortunately, ablative printing plates can only be exposed on imaging devices that are fitted with a vacuum device to collect the by-products of the ablative imaging step (particulate and gaseous debris). Recently the use of a laser transparent, water-soluble top coating over an ablatable imaging layer such that when ablatively removed with a laser, the ablative debris is contained by the top coating, has been proposed. See for example WO99/41077 and U.S. Pat. No. 6,468,717.

A water-soluble overcoat may also be provided to protect the hydrophilic layer during storage and handling and to improve lithographic latitude. See for example U.S. Pat. No. 5,997,993, U.S. Pat. No. 6,171,748, U.S. Pat. No. 6,468,717, U.S. Pat. No. 6,503,684 and U.S. Pat. No. 6,513,433.

BRIEF SUMMARY OF THE INVENTION

Polymer materials are described that undergo a two-level three-dimensional crosslinking process. During this process, hydrophilic polymers are crosslinked at two levels, the first results in a low level of crosslinking which leads to a toughening of the layer preventing dissolution by the fountain solution but with the layer remaining hydrophilic. The second level of crosslinking is higher and is the result of exposure with a laser diode thermal imaging device. The crosslinking at this second level results in a loss of hydrophilicity and provides instead an oleophilic image capable of accepting and transferring oil-based ink. The polymer materials are particularly useful in lithographic printing systems where they may be used in articles such as a printing plate precursor comprising a substrate having coated thereon a layer that becomes less hydrophilic upon exposure to thermal energy (for example, heat, particularly heat applied by a laser, other collimated light, or thermal printhead) that effects crosslinking (initial crosslinking or increased crosslinking) in the layer, the layer comprising a mixture of a crosslinked polymer and a thermally active crosslinking metal compound (for example, a metal salt, metal ester or metal oxide).

In one embodiment of the invention, a printing plate precursor includes an overcoat layer eluable in aqueous media. Said overcoat is useful for a printing plate precursor comprising on a substrate a layer comprising a mixture of a crosslinked polymer and a thermally active crosslinking metal compound. The overcoat layer has been found to protect the heat-sensitive crosslinked polymer layer from discoloration, contamination and scratching. Further, it has been found that the overcoat layer will reduce odor and particulate emissions during exposure of the printing plate precursor.

According to one aspect of the invention, there is provided a printing plate precursor comprising a substrate having coated thereon a first layer comprising a heat-sensitive composition and an overcoat layer eluable in aqueous media.

According to a further aspect of the invention, there is provided a printing plate precursor comprising a substrate having coated thereon in the following order, (a) a hydrophilic layer comprising a mixture of a crosslinkable polymer and a thermally active crosslinking metal salt and (b) an overcoat eluable in aqueous media, the hydrophilic layer capable of becoming less hydrophilic upon exposure to radiation that effects crosslinking in the layer.

According to a further aspect of the invention, there is provided a heat-sensitive composition comprising: (a) a crosslinkable hydrophilic polymer, (b) a thermally active crosslinking metal salt, (c) an infrared radiation sensitive dye that is soluble in a solvent, the solvent being water or a water-miscible organic solvent, the infrared sensitive dye having maximum absorption at wavelengths greater than 700 nm as measured in the solvent.

According to a further aspect of the invention, there is provided a method of making a printing plate comprising the steps of (a) providing a printing plate precursor, the precursor comprising a substrate having coated thereon in the order stated: (i) a hydrophilic imaging layer comprising a mixture of a crosslinkable polymer and a thermally active crosslinking metal salt and (ii) an overcoat eluable in squeous media, (b) imagewise exposing said printing plate precursor to provide exposed and unexposed areas in the imaging layer, whereby the exposed areas are rendered less hydrophilic than the unexposed areas by heat provided by the imagewise exposing and (c) removing the overcoat in the unexposed areas by contacting the printing plate precursor with at least one of lithographic printing ink and fountain solution.

According to a further aspect of the invention there is provided a method of imaging comprising the steps of (a) providing a printing plate precursor as aforesaid, and (b) imagewise exposing said printing plate precursor to provide exposed and unexposed areas in the imaging layer of said printing plate precursor, whereby the exposed areas are rendered less hydrophilic than the unexposed areas by heat provided by the imagewise exposing.

DETAILED DESCRIPTION OF THE PREFERRED EMBODIMENT

The present invention relates to polymer materials that undergo a two-level three-dimensional crosslinking process. During this process, hydrophilic polymers are crosslinked at two levels, the first results in a low level of crosslinking, which leads to a toughening of the layer preventing dissolution by the fountain solution but with the layer remaining hydrophilic. The second level of crosslinking is higher and is the result of exposure to a laser diode thermal imaging device. The crosslinking at this second level results in a loss of hydrophilicity and provides instead an oleophilic image capable of accepting and transferring oil based ink.

The polymer materials are particularly useful in lithographic printing systems where they may be used in articles such as a heat-sensitive printing plate precursor comprising a substrate having coated thereon a layer that becomes less hydrophilic upon exposure to thermal energy (for example, heat, particularly heat applied by a laser, other collimated light, or thermal printhead) that effects crosslinking (initial crosslinking or increased crosslinking) in the layer, the layer comprising a mixture of a crosslinked hydrophilic polymer and a thermally active crosslinking metal compound (for example, a metal salt, metal ester or metal oxide); with the printing plate precursor further having an overcoat eluable in aqueous media on the crosslinked hydrophilic layer. The term "eluable in aqueous media" is used to describe a property of the overcoat layer coated on the crosslinked hydrophilic layer, whereby the overcoat layer, but not the crosslinked hydrophilic layer, is removable by dissolving and/or dispersing it in an aqueous medium like water or fountain solution as used on printing presses. The term "substrate" is used here to describe any generic substrate on which a thermally sensitive medium may be deposited, including flat sheets, sleeves and press cylinders. Among the most useful materials are metal substrates, such as aluminum, copper, brass, iron, and alloys. Substrates coated with or layered with a surface of metal are included within the term "metal layer." If the layer is a solid (rather than coated) metal layer, it will be referred to as a "solid metal" layer as opposed to the generic term "metal" layer or "metal coated" layer.

Without wishing the present invention to be limited in any way by a proposed mechanism, the inventors believe that the crosslinking reactions of the crosslinkable polymer are interdependent with the crosslinking reactions of the metal compound. The term "interdependent" is used here to mean that crosslink bridges that are formed on the polymer during the thermal imaging treatment include residue of the metal compound or metal salt as part of the bridge, rather than the metal compound merely acting as a catalyst for the production of additional crosslinking bonds from the polymer or typically organic crosslinking agents added in combination with the active groups on the polymer. That is, the polymer first crosslinks with itself or with other specific crosslinking agents that react with organic groups in the monomer to form a first crosslinked polymeric chain or with other organic materials provided in the composition specifically for that crosslinking reaction. When the metal salts are thermally activated in the presence of the already crosslinked polymer, the metal compounds further react with, and possibly bridge with, the statistically remaining polymerizable sites of the already crosslinked polymer or residues or polymer that have not yet crosslinked within the polymer mass. Optionally, other ingredients (additional thermal crosslinking monomers or agents) may be specifically provided for reaction with those metal compounds or polymers.

As examples to assist in the understanding of the term "interdependent," two polymer systems will be considered. A first system comprises a crosslinked acrylic polymer, having available carboxylic acid groups remaining on the polymer. When a metal salt or metal compound, having an at least divalent metal atom, is heated in the presence of the crosslinked polymer having available acid groups, the metal will form additional crosslinking within the polymer structure.

In a second virtual system, a first crosslinked network can be formed by an epoxy resin with linking groups having been formed by conventional compounds having a multiplicity of groups that are reactive in the epoxy polymerization process. A second polymer, either itself crosslinked with additional groups available or a linear polymer containing groups that are reactive with the thermally activatable metal compounds or thermally activated metal salts of the present invention, is also present in the composition. This could be an acrylic material, a carboxylic acid substituted polyurethane, a polyester having pendant carboxylic acid groups, or the like. When the thermally activated metal salts react to crosslink this second polymer, the crosslinking bonds do not form between the primary epoxy crosslinked polymer, but form an independent network of crosslinked polymer. Such systems might also be referred to in the art as an interpenetrating network of distinct polymer chains, although the polymers known to the inventors have been manufactured by distinctly different polymerization and crosslinking mechanisms. These are therefore independent networks of polymers, without the crosslinking effected by the metal salts directly contributing to the crosslink bonds in the already crosslinked polymer.

The residues of the metal compounds, such as metal cations, may also react with available groups on the polymer, as when they form salts with acid groups, but this reaction is not necessarily effective with regard to causing or adding three-dimensional structure to the polymer network or the compositional network. In this manner, the polymer network formed may have crosslink bonds consistent with bonding exclusively by native polymeric material as well as crosslink bonds formed by bridging of the native polymeric material by moieties provided by the metal compounds.

The crosslinkable polymer of the invention is a thermosetting polymer and may comprise any polymeric that is a crosslinked/hardened polymer after it is coated onto a substrate and dried. Typically, the coating formulation would comprise a resin or prepolymer, where the initial polymerization had been carried to only a relatively low stage of completion, in order to keep the prepolymer low-meltable and/or soluble. The polymerization is driven to completion during a subsequent drying and/or heating and/or baking step of the coated material. The crosslinked polymer may be more greatly crosslinked (for example, its crosslink density, the number or crosslinking bonds per molecular weight, will increase) after it is irradiated according to the procedures of exposure in the present invention. Thermosetting resins differ from thermoplastic polymers in that they become substantially infusible or insoluble since they are cured (crosslinked) as opposed to the thermoplastics, which are typically not crosslinkable and soften when exposed to heat and are capable of returning to original conditions when cooled.

Representative examples of thermosetting polymers which may be useful in the practice of the present invention include:

a) thermosetting phenolic resins which are made by condensation of phenols with aldehydes; including but not limited to thermosettable resins containing sufficient reactive groups that can allow three-dimensional polymerization between or among such units as alkoxy-silane units, aryloxy-silane units, ethylenically unsaturated units, polyols, polyacids, poly(meth)acrylate units, isocyanate units, resorcinol, p-tertiaryoctylphenol, cresol, alkylated phenolic novolac, phenolic polyvinyl butyral, and phenolic cresol and an aldehyde such as formaldehyde, acetaldehyde or furfural;

b) thermoset polyimide resins such as those curable resins based on pyromellitic dianhydride, 3,3',4,4'-benzophenone-carboxylic dianhydride and meta-phenylenediamine;

c) thermoset epoxides or epoxy resins such as the resins containing the reaction product bisphenol A or derivatives thereof, for example, the diglycidyl ether of bisphenol A, or a polyol such as glycerol with epichlorohydrin and a crosslinking or curing agent such as a polyfunctional amine, for example, polyalkylenepolyamine;

d) thermoset polyester resins such as the condensation products of saturated or unsaturated di- or polybasic carboxylic acids or anhydrides, such as phthalic, adipic, maleic or fumaric acid, succinic or pyromellitic anhydride) with di- or polyhydric alcohols such as ethylene, propylene, diethylene and dipropylene glycol which cure upon using an ethylenic unsaturated curing agent such as styrene or diallyl phthalate, including thermosettable allyl resins including resins derived from diallyl phthalates, for example, diallyl orthophthalate, diallyl isophthalate, diallyl fumarates and diallyl maleates;

e) thermoset polyurethanes including those derived from the reaction of a diisocyanate, for example, toluene diisocyanate, methylene diphenyl diisocyanate, or isophorone diisocyanate, or a polymeric isocyanate with a polyhydric alcohol such as polypropylene glycol and, if required, an additional crosslinking agent such as water;

f) thermoset urea resins;

g) thermoset melamine resins, furan resins, and vinyl ester resins including epoxy (meth)acrylates. Where the term "(meth)acrylic" or "(meth)acrylate" is used, that term is inclusive of both acrylic and methacrylics.

The polymer may include additional additives, such as adhesion promoting additives such as acrylonitrile, compounds with phosphonic acid groups on it, benzotriazoles.

It is preferable that the crosslinkable polymer comprises an ethylenically unsaturated polymer, and more preferable that the polyethylenically unsaturated polymer comprises a (meth)acrylic polymer.

It is also preferred that the metal compound of the invention comprises a metal salt, such as a metal salt of a sulfamide, such as where the metal salt is selected from the class consisting of metal salts of sulfamide, sulfanylamide, acetosulfamine, sulfapyridine, sulfaguanidine, sulfamethoxazole, sulfathiazole, sulfadiazine, sulfamerazine, sulfamethazine, sulfaisoxazole, homosulfamine, sulfisomidine, sulfaguanidine, sulfamethizole, sulfapyradine, phthalisosulfathiazole and succinylsulfathiazole. The metal salts may also comprise any other metal organic salt (particularly light-insensitive salts such as light insensitive silver salts) such as metal salts of organic acids, sulfonates, saccharides, compounds containing mercapto, thione or imine groups, examples of these include, but are not limited to, silver behenate, silver saccharide, silver mercapto-amino-thiadiazole, silver benzothiazole, silver diethyldithiocarbamate, silver mercapto-benzimidazole, silver benzamidazole, silver benzotriazole, and other salts and complexed salts (for example, U.S. Pat. No. 4,260,677, the specification of which is incorporated herein by reference) known to be thermally degradable as in photothermographic imaging systems.

Where the thermal address is to be performed by lasers, it is desirable to have photothermal converters present in the composition that absorb the radiation in the region of luminance wavelength of a laser and convert it to thermal energy. Such substances include dyes, pigments and coloring materials, which are disclosed in JOEM Handbook 2 Absorption Spectra of Dyes for Diode Lasers, MATSUOKA, Ken, Bunshin Shuppan, 1990 and Chapter 2, 2.3 of Development and Market Trend of Functional Coloring Materials in 1990's, CMC Editorial Department, CMC, 1990, such as polymethine type coloring materials (cyanine dyes), phthalocyanine type coloring materials, oxonol type dyes, dithiol metallic complex salt type coloring materials, naphthoquinone, anthraquinone type coloring materials, triphenylmethane type coloring materials, aluminum, diiminonium type coloring materials, azo type dispersion dyes, indoaniline metallic complex coloring materials, and intermolecular CT coloring materials. The representative examples include N-[4-[5-(4-dimethylamino-2-methylphenyl)-2,4-pentadienylidene]-3-methyl-2,5-cyclohexadiene-1-ylidene]-N,N-dimethylammonium acetate, N-[4-[5-(4-dimethylaminophenyl)-3-phenyl-2-pentene-4-in-1-ylidene]-2,5-cyclohexadiene-1-ylidene]-N,N-dimethylammonium perchlorate, N,N-bis(4-dibutylaminophenyl)-N-[4-[N,N-bis(4-dibutylaminophenyl)amino]phenyl]-aminium hexafluoroantimonate, 5-amino-2,3-dicyano-8-(4-ethoxyphenylamino)-1,4-naphthoquinone, N'-cyano-N-(4-diethylamino-2-methylphenyl)-1,4-naphthoquinonedii mine, 4,11-diamino-2-(3-methoxybutyl)-1-oxo-3-thioxopyrrolo[3,4-b]anthracen-5,1 0-dione, 5,16-(5H,16H)-diaza-2-butylamino-10,11-dithiadinaphtho[2,3-a:2'3'-c]-naphthalene-1,4-dione, bis(dichlorobenzene-1,2-dithiol)nickel(2:1)tetrabutylammonium, tetrachlorophthalocyanin aluminum chloride, and polyvinylcarbazol-2,3-dicyano-5-nitro-1,4-naphthoquinone complex. Carbon black, other black body absorbers, and other infrared absorbing materials, dyes or pigments may also be used as the photothermal converter, particularly with higher levels of infrared absorption/conversion at 810–880 nm, and particularly between 810–850 nm.

The coating materials of the invention can be applied to a substrate and dried by the standard coating and drying methods employed in the manufacture of printing plate precursors and other metal, plastic and paper products and need not be discussed in detail. An important characteristic of the dried layer is its adhesion to the substrate. This allows the use of materials other than grained, anodized lithographic aluminum for the substrate of the plate.

The compositions may be applied from any solvent that supports the system. Preferred solvents include methyl amyl ketone, xylene, PM acetate, toluene, "Cellosolve" acetate, ethanol, isopropyl alcohol, methoxy propanol, ethoxy ethyl acetate, ethyl benzene, diethyl "Cellosolve", and mixtures thereof or mixtures with water. The more preferred hydrocarbon solvents include ethanol, isopropyl alcohol, and methoxy propanol, and mixtures thereof. Water-borne coating formulations may be prepared by combining with a suitable coalescent ingredient or coalescent mixture, a suitable polymeric thickener, a suitable leveling aid, a suitable plasticizer, a suitable pigment, and other suitable additives. As noted above, a suitable hydrocarbon solvent or hydrocarbon solvent mixture may be combined with water to produce a particular volatile liquid carrier. In certain other embodiments, however, a particular suitable volatile liquid carrier might not include water.

The lithographic printing plate precursor of the invention preferably comprises an overcoat eluable in aqueous media provided on the heat-sensitive hydrophilic layer to improve the overall performance of the lithographic printing plate. The inventors have found that an aqueous-soluble or aqueous-dispersible overcoat on top of the heat-sensitive hydrophilic layer will prevent the surface of the heat-sensitive layer from being contaminated and/or scratched during storage and/or handling. The aqueous-soluble or aqueous-dispersible overcoat provided on the heat-sensitive hydrophilic layer of the lithographic printing plate precursor will also prevent color changes/shifts or discoloration in the plate coating due to exposure to air.

Even though the lithographic printing plate precursor of the invention does not work by an ablation mechanism, small amounts of emissions (dust, odor) are produced upon exposure. This exposure-related fine debris will negatively affect fine (10 and 20 micron) resolution required for high-resolution imaging. It has been found that an overcoat eluable in aqueous media will effectively trap fine debris and thereby permit such imaging. As the lithographic printing plate precursor of the invention does not require a wet processing step after exposure, the overcoat eluable in aqueous media has been designed to be easily removable during start-up on press. Some of the specific requirements taken into consideration during the design, were the eluability in water or fountain, a high thermal stability to ensure minimal thermal degradation during imaging, a low melting range to allow trapping and encapsulation of fine debris, minimal compatibility with the heat-sensitive hydrophilic layer to allow rapid removal, chemical inertness to satisfy product shelf life requirements. The overcoat thus comprises a resin, or a mixture of resins, selected from the group of watersoluble organic polymers.

Representative examples of these resins include polyvinylalcohol, polyvinylacetate, polyacrylic acid, poly(meth) acrylic acid or its alkali metal salt and amine salt, poly 2-hydroxyethyl(meth)acrylate, poly(meth)acrylamide, polyvinyl methyl ether, polyvinyl methyl ether/maleic anhydride copolymer, polyvinylpyrollidone, poly-2-acrylamide-2-methylpropane sulfonic acid and alkali metal or amine salt thereof, gum arabic, cellulose and modification product thereof, polysaccharides such as dextran, pullulan, or chitosan. The term "saccharide" is used herein as defined by IUPAC, being inclusive of monosaccharides and di-, oligo- and polysaccharides, the di-, oligo- and polysaccharides being made up of a plurality of monosaccharide units linked to each other by a glycosidic bond.

The inventors have found that an overcoat comprising only polyvinyl alcohol shows good chemical stability and functions well as a debris trap, but the eluability is compromised due to strong adhesion between the layers. The inventors found that by adding another polymer, especially if this other polymer comprises chitosan, the eluability is significantly improved, while improved scratch resistance is an added benefit. The cause for this is an antagonistic effect between the polymer of the heat-sensitive hydrophilic layer and chitosan and a synergistic blending effect between chitosan and polyvinyl alcohol resulting in increased hardness. Effects between thermoplastic coating resins and cellulose derivatives are well documented with respect to increase in hardness, wear, and related properties. Common cellulose derivatives for the required application are not water eluable and are not used in the polymer blends of the present invention. Chitosan has not been used for such applications in the prior art, but has similar beneficial blending properties.

The protective overcoat may comprise additional ingredients, such as a second polymer, a plasticizer to give the coating flexibility and reduce cracking, a light-to-heat-converting agent to counteract any speed loss due to the additional coating thickness, a surfactant or wetting agent to improve coatability, and a highly water-soluble crystalline compound to accelerate the breakdown of the structural integrity of of the overcoat during roll-up on press. Representative examples of suitable plasticizers are ethylene glycol, glycerin, sorbitol, carboxymethylcellulose. Preferably, the light-to-heat converting agent is a water-soluble dye, for example, a water-soluble cyanine dye as described in U.S. Pat. No. 6,159,657, U.S. Pat. No. 6,397,749, U.S. Pat. No. 6,410,202, or as commercially available from FEW Chemicals (www.few.de/water-soluble cyanine dyes), but other IR-absorbing dyes may be used as well. Useful examples of highly water-soluble crystalline compounds have been described in U.S. Pat. No. 5,677,110. An especially preferred highly water-soluble crystalline compound is glucose.

An aqueous solution of the overcoat ingredients is prepared. The overcoat layer is applied to the printing plate precursor over the dried hydrophilic layer by means of spraying, doctor blade, roller, manually, or by other similar or conventional application methods well-known in the art. The overcoat layer is then dried, for example in an oven. The dried overcoat weight can be selected to be in any desired range, a preferred range being about 0.25 to 1.3 grams per square meter.

Printing plate precursors made in accordance with the invention are imaged by imagewise exposing the precursor to provide exposed and unexposed areas in the imaging layer, the exposed areas being rendered less hydrophilic than the unexposed areas by the heat generated by the exposing. For embodiments of the precursor having an overcoat layer, that layer is then removed in the unexposed areas by contacting the precursor with fountain solution or lithographic printing ink. The removal of the overcoat layer may be carried out on-press or off-press.

Desription of Synthesis of the Salts and Polymers

All of the silver salts and the metal salts of the sulfamides can be readily synthesized by a reaction of sodium sulfamide with a silver salt, such as silver nitrate. A general example of this is the synthesis of silver sulfadiazine, which was prepared by reacting equal-molar concentrations of sulfadiazine and silver nitrate. The insoluble reactant was washed until the supernate was silver-free after adding sodium chloride (0.9%) in volumes ten times that of the silver sulfadiazine supernatant. The silver sulfadiazine was washed with acetone and then separate washings of petroleum ether. The precipitate was then placed in a desiccator until all ether had been removed and the precipitate was a dry white, fluffy material.

Representative examples of three-dimensionally crosslinkable hydrophilic polymers are as follows. For the crosslinkable hydrophilic polymer, a hydrophilic homopolymer or a hydrophilic copolymer is synthesized using one or more hydrophilic monomers having a hydrophilic group selected from a carboxyl group or its salt, a sulfonic group or its salt, a phosphoric group or its salt, an amino group or its salt, a hydroxyl group, an amide group and an ether group such as a (meth)acrylic acid or its alkali metal salt and amine salt, an itaconic acid or its alkali metal salt and amine salt, 2-hydroxyethyl(meth)acrylate, (meth)acrylamide, N-monomethylol(meth)acrylamide, N-dimethylol(meth) acrylamide, allyl amine or its hydrohalogenic acid salt, 3-vinylpropionic acid or its alkali metal salt and amine salt, vinyl sulfonic acid or its alkali metal salt and amine salt, 2-sulfoethyl(meth)acrylate, polyoxyethylene glycol mono (meth)acrylate, 2-acrylamide-2-methylpropanesulfonic acid, and, acid phosphoxy polyoxyethylene glycol mono (meth)acrylate.

For hydrophilic polymers having a functional group such as a carboxyl group or its salt, an amino group or its salt, a hydroxyl group, and an epoxy group introduce an additional polymerizable ethylenically unsaturated group such as a vinyl group, an allyl group and a (meth)acryloyl group or a ring formation group such as a cinnamoyl group, a cinnamylidene group, a cyanocinnamylidene group and p-phenylenediacrylate group. The obtained polymers containing these unsaturated groups are mixed with monofunctional and polyfunctional monomers copolymerizable with the unsaturated groups, the below-mentioned polymerization initiator, and the below-mentioned other components, if necessary. Then, it is dissolved in a proper solvent to prepare a dope. The dope is applied to a substrate, and crosslinked after or during drying to obtain a three-dimensionally crosslinked polymer.

For hydrophilic polymers having a functional group containing active hydrogen such as a hydroxyl group, an amino group or a carboxyl group are mixed with an isocyanate compound or a blocked polyisocyanate, and the below-mentioned other components. Then, the obtained mixture is dissolved in a solvent which does not contain the active hydrogen to prepare a dope. The resulting dope is applied to a substrate, and three-dimensionally crosslinked after or during drying to obtain a crosslinked binder polymer.

Furthermore, a monomer having a glycidyl group such as glycidyl (meth)acrylate, a carboxylic group such as (meth) acrylic acid, and/or an amino group can be used as a copolymerizable component of the crosslinkable hydrophilic polymer. The hydrophilic polymers having a glycidyl group are three-dimensionally crosslinked by a ring-opening reaction, in which the polymer reacts with, as a crosslinking agent, alpha, omega-alkane- or alkene-dicarboxylic acid such as 1,2-ethanedicarboxylic acid and adipic acid, or a polycarboxylic acid such as 1,2,3-propanetricarboxylic acid and trimellitic acid, or a polyamine compound such as 1,2-ethanediamine, diethylenediamine, diethylenetriamine and alpha, omega-bis-(3-aminopropyl)-polyethylene glycol ether, or an oligoalkylene or polyalkylene glycol such as ethylene glycol, propylene glycol, diethylene glycol and tetraethylene glycol, or a polyhydroxy compound such as trimethylolpropane, glycerin, pentaerythritol and sorbitol.

The hydrophilic polymers having a carboxylic group and an amino group are three-dimensionally crosslinked by an epoxy ring-opening reaction, in which the polymer reacts with a polyepoxy compound, as a crosslinker, such as ethylene or propylene glycol diglycidyl ether, polyethylene or polypropylene glycol diglycidyl ether, neopentyl glycol diglycidyl ether, 1,6-hexanediol diglycidyl ether, or trimethylolpropane triglycidyl ether.

When a polysaccharide such as cellulose derivatives, a polyvinyl alcohol or its partially saponified derivatives, a glycidol homopolymer or copolymer, or their derivatives are used as a hydrophilic polymer, the above-mentioned crosslinkable functional groups are introduced into the polymer through the hydroxyl groups which the above compounds possess. As a result, a three-dimensional crosslink is accomplished according to the above methods.

When a polysaccharide such as chitosan having an amino group is used as the crosslinkable hydrophilic polymer, a crosslink by imine formation is accomplished according to the "Schiff base" mechanism, in which the crosslinkable polymer (chitosan) reacts with a di-aldehyde, such as glyoxal or glutaric dialdehyde.

Furthermore, a hydrophilic polyurethane precursor is produced by reacting a polyol having a hydroxyl group such as polyoxyethylene glycol at the termini of the polymer or a polyamine having an amino group at the termini (ends) of the polymer with polyisocyanate such as 2,4-tolylene diisocyanate, 2,6-tolylene diisocyanate, 1,6-hexamethylene diisocyanate, or isophorone diisocyanate. Then, an additional polymerizable ethylenically unsaturated group or a ring-forming group is introduced into the hydrophilic polyurethane precursor to obtain a hydrophilic polymer. The hydrophilic polymer can be three-dimensionally crosslinked by the above-mentioned method. When the hydrophilic polyurethane precursor has an isocyanate group at its termini, the precursor is reacted with a compound containing an active hydrogen such as glycerol mono(meth)acrylate, 2-hydroxyethyl(meth)acrylate, 2-hydroxypropyl(meth)acrylate, N-monomethylol(meth)acrylamide, N-dimethylol (meth)acrylamide, (meth)acrylic acid, cinnamic acid, or cinnamic alcohol. When the precursor has a hydroxyl group or an amino group at its termini, it is reacted with (meth) acrylic acid, glycidyl(meth)acrylate and/or 2-isocyanatoethyl(meth)acrylate.

When polymers comprising a polybasic acid and a polyol, or a polybasic acid and a polyamine are used as a crosslinkable hydrophilic polymer, they are applied on a substrate. Then, they are heated for a three-dimensional crosslinking. When casein, glue, and gelatin are used as a hydrophilic polymer, their water-soluble colloidal compounds are heated for three-dimensional crosslinking to obtain a net structure.

Further, a hydrophilic polymer can be produced by reacting a hydrophilic polymer having a hydroxyl group or an amino group with a polybasic acid anhydride containing two or more acid anhydride groups in one molecule to obtain a three-dimensionally crosslinked hydrophilic polymer. The hydrophilic polymer includes a homopolymer or copolymer comprising a hydroxyl group containing monomers such as 2-hydroxyethyl(meth)acrylate and vinyl alcohol, and allyl amine; partially saponified polyvinyl alcohol; a polysaccharide such as cellulose derivatives; and glycidol homopolymer or copolymer. Representative examples of the polybasic acid anhydride used are ethylene glycol bis anhydro trimellitate, glycerol trisanhydro trimellitate, 1,3,3a,4,5,9b-hexahydro-5-(tetrahydro-2,5-dioxo-3-furanyl)naphtho[1,2-

C]-furanyl-1,3-dione, 3,3',4,4'-diphenylsulfone tetracarboxylic dianhydride, 1,2,3,4-butanetetracarboxylic dianhydride and the like.

When the hydrophilic polymer comprises polyurethane having isocyanate groups at its termini and a compound containing active hydrogen such as polyamine and polyol, these compounds and other components listed below are dissolved or dispersed in a solvent. They are applied to the substrate, and the solvent is removed. Then, the plate is cured at a temperature to obtain three-dimensional crosslinking. In this case, hydrophilic property is given by introducing a hydrophilic functional group into segments of either polyurethane or a compound containing active hydrogen or the segments both of them, or into their side chain. The segments and functional groups possessing hydrophilic property can be selected from the above list.

The polyisocyanate compounds used in the present invention include 2,4-tolylene diisocyanate, 2,6-tolylene diisocyanate, 4,4'-diphenylmethane diisocyanate, 1,5-naphthalene diisocyanate, tolidine diisocyanate, 1,6-hexamethylene diisocyanate, isophorone diisocyanate, xylene diisocyanate, lysine diisocyanate, triphenylmethane triisocyanate, bicycloheptane triisocyanate.

In some cases, it is preferred to block (mask) the isocyanate groups by the conventional method for the purpose of preventing the isocyanate groups from changing at handling before and after the coating process. For example, the isocyanate groups can be blocked with acid sodium sulfite, aromatic secondary amine, tertiary alcohol, amide, phenol, lactam, heterocyclic compounds, ketoxime and the like according to the methods disclosed in Lecture for Plastic Material vol. 2—Polyurethane Resin—(IWATA, Keiji, Nikkan Kogyo Shimbun, 1974) pp. 51–52 and Polyurethane Resin Handbook (IWATA, Keiji, Nikkan Kogyo Shimbun, 1987) pp. 98, 419, 423 and 499. Preferably, the isocyanate groups are blocked with a compound having a low recovering temperature of isocyanate and hydrophilic property such as acid sodium sulfite.

An additional polymerizable unsaturated group may be added to either nonblocked or blocked polyisocyanates as mentioned above for the purpose of strengthening the crosslink or using it for a reaction with an oleophilic material.

The degree of crosslink, i.e., an average molecular weight between crosslinks, of the hydrophilic polymer of the present invention, which differs depending on the type of segments used and the type and amount of associative functional groups, is determined according to the required printing durability. Generally, the average molecular weight between crosslinks is fixed between 500 and 50,000, which may be measured either before the second crosslinking step in the procedure or after the second crosslinking step in the procedures practiced in the present invention. When it is smaller than 500, the printing plate is likely to be brittle and printing durability is deteriorated, although the plate is still functional. When it is greater than 50,000, printing durability may be deteriorated due to swelling by fountain or dampening water, but again, the plate is still functional. In view of the balance of printing durability and hydrophilic property, the average molecular weight between crosslinks is preferably 800 to 30,000, more preferably 1,000 to 10,000 at the conclusion of crosslinking steps in the preparation of the actual imaged and processed plate of the present invention.

Of these, the hydrophilic polymers comprising hydrophilic homopolymer or copolymer synthesized using one or more hydrophilic monomers having a hydrophilic group selected from a carboxyl group or its salt, a sulfonic group or its salt, a phosphoric group or its salt, an amino group or its salt, a hydroxyl group, an amide group and an ether group such as a (meth)acrylic acid or its alkali metal salt and amine salt, an itaconic acid or its alkali metal salt and amine salt, 2-hydroxyethyl(meth)acrylate, (meth)acrylamide, N-monomethylol(meth)acrylamide, N-dimethylol(meth)acrylamide, allylamine or its hydrohalogenic acid salt, 3-vinyl propionic acid or its alkali metal salt and amine salt, vinyl sulfonic acid or its alkali metal salt and amine salt, 2-sulfoethylene(meth)acrylate, polyoxyethylene glycol mono(meth)acrylate, 2-acrylamide-2-methylpropane sulfonic acid and acid phosphoxy polyoxyethylene glycol mono(meth)acrylate: or polyoxymethylene glycol or polyoxyethylene glycol which are three-dimensionally crosslinked according to the above mentioned methods are preferred.

The hydrophilic polymer of the present invention may be used with the following monofunctional monomer or polyfunctional monomer. Representative examples include, those disclosed in Handbook for Cross-Linking Agents, edited by YAMASHITA, Shinzo and KANEKO, Tosuke, Taiseisha, 1981; Hardening System with Ultraviolet, KATO, Kiyoshi, Comprehensive Technology Center, 1989; UV.cndot.EB Hardening Handbook (Material), edited by KATO, Kiyoshi, Kobunshi Kankokai, 1985; pp. 102–145 of New Practical Technology for Photosensitive Resin, supervised by AKAMATSU, Kiyoshi, CMC, 1987 and the like, N,N'-methylenebisacrylamide, (meth)acryloylmorpholine, vinyl pyridine, N-methyl(meth)acrylamide, N,N-dimethyl(meth)acrylamide, N,N-dimethylaminopropyl(meth)acrylamide, N,N-dimethylaminoethyl(meth)acrylate, N,N-diethylaminoethyl(meth)acrylate, N,N-dimethylaminoneopentyl(meth)acrylate, N-vinyl-2-pyrrolidone, diacetone acrylamide, N-methylol(meth)acrylamide, parastyrene sulfonic acid or its salt, methoxytriethylene glycol (meth)acrylate, methoxytetraethylene glycol (meth)acrylate, methoxypolyethylene glycol (meth)acrylate (PEG number-average molecular weight: 400), methoxypolyethylene glycol (meth)acrylate (PEG number-average molecular weight: 1,000), butoxyethyl(meth)acrylate, phenoxyethyl(meth)acrylate, phenoxydiethylene glycol (meth)acrylate, phenoxypolyethylene glycol (meth)acrylate, nonylphenoxyethyl(meth)acrylate, dimethylol tricyclodecane di(meth)acrylate, polyethylene glycol di(meth)acrylate (PEG number-average molecular weight: 400), polyethylene glycol di(meth)acrylate (PEG number-average molecular weight: 600), polyethylene glycol di(meth)acrylate (PEG number-average molecular weight: 1,000), polypropylene glycol di(meth)acrylate (PPG number-average molecular weight: 400), 2,2-bis[4-(methacryloyloxyethoxy)phenyl]propane, 2,2-bis[4-(methacryloyl-oxy-diethoxy)phenyl]propane 2,2-bis[4-methacyloyl-oxy-polyethoxy)phenyl]propane or its acrylate, beta-(meth)acryloyl-oxyethyl hydrogen phthalate, beta-(meth)acryloyl-oxyethyl hydrogen succinate, polyethylene or polypropylene glycol mono(meth)acrylate, 3-chloro-2-hydroxypropyl(meth)acrylate, 1,3-butylene glycol di(meth)acrylate, 1,6-hexanediol di(meth)acrylate, neopentyl glycol di(meth)acrylate, trimethylolpropane tri(meth)acrylate, tetramethylolmethane tri(meth)acrylate, tetramethylolmethane tetra(meth)acrylate, isobomyl(meth)acrylate, lauryl(meth)acrylate, tridecyl(meth)acrylate, stearyl(meth)acrylate, isodecyl(meth)acrylate, cyclohexyl(meth)acrylate, tetrafurfuryl (meth)acrylate, benzyl(meth)acrylate, mono(2-(meth)acryloyl-oxyethyl)acid phosphate, glycerin mono(meth)acrylate or glycerin di(meth)acrylate, tris(2-(meth)acryloyloxyethyl)isocyanurate, N-phenylmaleimide, N-(meth)acryloxy succinate imide, N-vinylcarbazole, divinylethylene urea, divinylpropylene urea and the like.

To effect a desired polymerization reaction, it may at certain times be necessary to include a suitable free-radical initiator or mixture of initiators, in our novel composition. Suitable initiators for this purpose include peracetic acid; hydrogen peroxide; di-tertiary-butyl peroxide ("DTBP"); as well as various percarbonates, persulfates, perphosphates, perborates, and azo compounds. Suitable azo-type free-radical initiators for purposes of this disclosure include 2,2'-azobisisobutyronitrile ("AIBN"), azobis(alpha, gamma-dimethylcapronitrile), azobisisobutyl nitrile, azobis(alpha-ethylbutyl nitrile), and azobisdimethyl valeronitrile. (See, for example, pages 194–197 and 215–223 of a well-known textbook entitled Principles of Polymerization, second edition, by George Odian, published in 1981 by John Wiley & Sons, Inc.). Among the well-known water-soluble initiators used in emulsion polymerization reactions and which may be mentioned are acetyl peroxide and hydrogen peroxide; hydroperoxides such as tertiary-butyl hydroperoxide; and sodium, potassium, ammonium and barium persulfate.

EXAMPLES

Material and Methods for the Examples:

All materials used in the following examples are readily available from standard commercial sources, such as Aldrich Chemical Co. (Milwaukee, Wis.), Polysciences, Inc. (Warrington, Pa.) or VWR Canlab, (Mississauga, Canada), unless otherwise specified. The molecular weight of the various polymers that were obtained were measured by the supplier using GPC against known standards.

Metal sulfa ligands, zinc nitrate hexahydrate and the silver sulfadiazine from Spectrum Chemical (Gardena, Calif.).

Hystreen 9022 is behenic acid from Witco Corp. (Greenwich, Conn.).

Silver AMT from Charkit Chemical Corp. (Darien, Conn.)

Kadox 911 is a zinc oxide from Zinc Corporation of America (Monaca, Pa.).

B72 or Butvar B76 are polyvinyl butyral resins from Solutia Inc. (St. Louis, Mo.).

Elvanol 52-22 is a partially hydrolyzed, cold water soluble polyvinyl alcohol of medium viscosity from DuPont Inc. (Wilmington, Del.).

ADS830A and ADS 830WS are infra-red absorbing dyes from American Dye Source Inc. (Montreal, Canada).

SDA3984 is an infrared absorbing dye from H.W. Sands Corp. (Jupiter, Fla.)

S0094 is an IR-dye from FEW Chemicals (Wolfen, Germany).

Neptun Blaubase 627 is a blue coloring dye from BASF (Ludwigshafen, Germany)

Tyzor™ TE, Tyzor™ AA-75 and Tyzor™ AA-135 are organic titanates (titanium chelates) from DuPont Inc (Wilmington, Del.)

Preparation:

Metal sulfa derivatives were all prepared by making the sodium salt of the ligand with sodium hydroxide and heating till dissolved. Adding this solution warm to a warm aqueous solution of the metal nitrate precipitating the metal sulfa derivative. The precipitate was filtered and dried in a 60 degree C. oven.

1. Silver Sulfamerazine was prepared using 26.43 g sulfamerazine, 300 ml of water, 4.00 grams of NaOH warming to 70 degree C. until dissolved. 16.99 grams of silver nitrate in 300 grams of water with 1 drop of 10% nitric acid and warming to 70 degree C. The sulfamerazine solution was added to the silver nitrate solution with stirring. Silver sulfamerazine precipitated as a fine white powder. This was filtered and washed three times with water and dried overnight at 60 deg to give an off-white powder.

2. Silver Sulfamethazine was prepared using 27.83 grams of sulfamethazine following procedure 1 (i.e. the procedure used for silver sulfamerazine) to give a fine white powder showing some crystallinity.

3. Silver sulfamethoxazole was prepared following procedure 1 and using 25.33 sulfamethoxazole. A fine white powder showing no crystallinity 4. Copper Sulfadiazine was prepared following procedure 1 and using 52.86 grams of sulfadiazine and 23.27 grams of cupric nitrate. The copper sulfadiazine was a dark purplish precipitate.

5. Iron Sulfadiazine was prepared using procedure 1 and using 18.8 g of sulfadiazine and 10.1 grams of ferric nitrate. The iron sulfadiazine, pinkish red powder had some white crystals present (some unreacted sulfadiazine).

6. Silver Behenate was prepared using procedure 1 and using 10 g of behenic acid and 4.8 g of silver nitrate to give a white powder.

7. Zinc sulfadiazine was prepared by using 90.1 grams of sodium sulfadiazine dissolved in water and 49.2 g zinc nitrate hexahydrate in water. When combined the white zinc sulfadiazine precipitated out. Filtered, rinsed with water and dried to yield a fine white powder.

Plate Formulations:

The general procedure used was to make a dispersion of each metal sulfa derivative by taking 15 grams of each, 7.5 grams of ZnO, Kadox™ 911, and 10.5 grams of 5% polyvinyl butyral (Butvar™ B72,) solution in ethanol and 117 grams of ethanol. This was ball milled with glass marble for 18–24 hours to form a stable dispersion. Each dispersion was formulated into a part A of a coating by mixing 16.1 grams of dispersion with 0.8 grams of a 5% acetic acid/water, 5.3 grams of water and 15.7 grams of isopropyl alcohol. A part B resin solution was mixed using 22.6 grams of 7.5% ethanol solution of polyacrylic acid, 450,000 MW from Polysciences. The molecular weight (MW) in this and other examples is a weight average molecular weight, as usually provided by the manufacturer.

Part A and part B were mixed by magnetic stirrer, and the resulting coating formulation was coated onto a substrate. After drying in air or in a traveling oven the plates were subjected to IR-laser exposure, and subsequently evaluated by running on a Ryobi single color printing press. All demonstrated good hydrophobic/hydrophilic balance with the imaged area taking the ink. All of the plates rolled up within 30 prints and were able print out to 3,000 except the iron sulfadiazine that showed marginal printing performance.

The compositions of the present invention are conveniently used in direct-to-press systems such as those described in detail in U.S. Pat. No. 5,713,287 (Gelbart). The print forme can then even be cleaned on press by various available commercial methods, for example cloth-type cleaners, spray wash cleaners, roller cleaners, dip cleaners, and the like.

In the following Examples, the preparation and application of the overcoat layer is shown in Examples 30 to 35.

Example 1

A dispersion was made by preparing a mixture containing 15 grams copper sulfadiazine, 7.5 grams of ZnO, and 10.5 grams of 5% polyvinyl butyral solution in ethanol and 117 grams of ethanol. The mixture was ball milled with glass marbles for 18–24 hours and then passed through a microfluidizer to form a stable dispersion. The dispersion was formulated into a part A of a two part coating system by mixing 16.1 grams of the dispersion with 0.8 grams of a 5% acetic acid/water, 5.3 grams of water and 15.7 grams of isopropyl alcohol. The part B resin solution was made using 22.6 grams of 7.5% ethanol solution of polyacrylic acid, 450,000 MW, 18.3 grams of 2% ethanol solution of infra red absorbing dye 830A, and 112 grams of ethanol. The materials were mixed using an in-line mixer just prior to being sprayed onto the back of an aluminum printing plate to give a dry coating weight of 2.5 g/square meter. The material was dried using warmed air and then imaged using a power of 10 Watts and an energy of 550 mJ/cm$^2$ on a Creo Inc. Trendsetter laser plate setting machine. The imaged sample was mounted onto a press, dampened and then used to print 500 good impressions. The plate was taken off the press and the ink removed using a plate cleaner. The coating was then removed using a cloth impregnated with 5% sodium carbonate. The plate was rinsed with water and dried. The substrate was re-coated with a further amount of the two-component mixture and dried. A new image was created onto the coating using the infrared imaging device and the plate used for printing. 1,000 good impressions were obtained. There was no evidence of the previous image on the print.

Example 2

A dispersion consisting of 7.5% silver behenate and 0.2% polyvinyl butyral in ethanol/water at a weight ratio of 70/30 was prepared. The mixture was ball milled overnight. The following formulation is made up: 5 g 1% chitosan, 5 g 0.3% ADS 830WS, 0.5 g 3% ADS 830A, 1.6 g silver behenate dispersion, 0.5 g 0.1 M glutaric dialdehyde, 0.25 g 1% dodecyl sodium sulfate. The components are mixed in a glass bottle using a magnetic stirrer and are coated onto grained, anodized aluminum plates. The plates were dried in air for 10 minutes to give a dry coat weight of 3 g/m$^2$ and then subjected to image-wise IR-laser exposure using a Creo Inc. Trendsetter using 400 mJ/cm$^2$ at 9 watts. The plate performance was evaluated by printing using a Ryobi press with coated paper and a commercial cold-set ink. The plate permitted full ink density to be achieved in less than 50 sheets. 12,000 good impressions were obtained from the plate.

Example 3

A plate was produced by coating the following formulation on to grained, anodized aluminum as follows: 5 g 1% chitosan, 5 g 0.3% ADS 830WS, 0.5 g 3% ADS 830A, 2.5 g silver sulfadiazine dispersion, 0.5 g 0.1M glutaric dialdehyde, 0.25 g 1% dodecyl sodium sulfate. The silver sulfadiazine dispersion consists of 8.5% silver sulfadiazine and 0.2% polyvinyl butyral in ethanol/water at a weight ratio of 70/30; the dispersion was milled before use. After drying in air, the plate was imaged using IR-laser exposure using 500 mJ/cm$^2$ at 16 watts. The plate was dampened with fountain solution for 30 seconds before the ink is applied to the plate. 12,000 impressions were printed with little deterioration of printing quality. Start-up performance was good and no scumming was evident during the print run.

Example 4

A formulation was prepared by a similar method to Example 3 except that 0.5 g of 0.1M glyoxal was used in place of glutaric dialdehyde. The formula was coated onto grained, anodized aluminum plates and dried in air. The coated plates were subjected to IR-laser exposure with an energy of 1500 mJ/cm$^2$ at 16 watts. The plate was mounted on a Ryobi press. The plate was run for 12,000 impressions displaying good printing performance.

Example 5

A formulation was prepared by a similar method to Example 3 except that an equal weight of silver sulfamethoxazole was used in place of the silver sulfadiazine. The formula was coated onto grained, anodized aluminum plates and dried in air. The coated plate was subjected to IR-laser exposure with an energy of 500 mJ/cm$^2$ at 16 watts. The plate was mounted on a Ryobi press and printed for 5,000 impressions displaying good printing performance.

Example 6

A dispersion was made from silver sulfamethoxazole 10%, ZnO 5.0% and polyvinyl butyral 0.35% and ethanol 84.65%. The dispersion was ball milled and then microfluidized to obtain a particle size of less than 2 microns. The following formula was made up using 4 g silver sulfamethoxazole dispersion, 1 g 7.5% poly(acrylic acid), 1 g 7.5% ethylene-alt-maleic acid copolymer, 0.5 g 3% ADS 830A and 1 g 0.03 M Tyzor™ AA-135 The components were mixed by magnetic stirrer, and then were manually coated onto grained, anodized aluminum plates. After drying in air for 10 minutes, the coated plates were subjected to IR-laser exposure using the Creo. Trendsetter platesetter. The imaging energy was 800 mJ/cm$^2$ at 16 watts. The plate was mounted on the Ryobi press and dampened for 30 seconds. 10,000 impressions of good quality print were obtained.

Example 7

A dispersion was made up in the same way as in Example 6 except that silver sulfamerazine was used in place of silver sulfamethoxazole. The silver sulfamerazine dispersion 4 g was then mixed with 1 g 7.5% poly(acrylic acid), 1 g 7.5% ethylene-alt-methacrylic acid copolymer, 0.5 g 3% ADS 830A and 1 g 0.03 M Tyzor AA-135. The coating was applied using a doctor box onto grained anodized aluminum plates and then dried in air to give a coating weight of about 2.5 g/m$^2$. The coated plates were imaged with a laser device with output at 830 nm using an energy of 800 mJ/cm$^2$ and 16 Watts of power. The plate was mounted on a press and 10,000 impressions of high quality print were obtained.

Example 8

A dispersion was made up in the same way as in Example 7 consisting of 10% silver sulfamethazine, 5.0% ZnO and 0.35% polyvinyl butyral in ethanol. The following formulation was made up: 4 g silver sulfamethazine dispersion, 1 g 7.5% polyacrylic acid, 1 g 7.5% styrene-alt-maleic acid copolymer, 0.5 g 3% ADS 830A and 1 g 0.03 M Tyzor™

AA-135 and mixed together. The formula was manually coated using a doctor box onto anodized aluminum plates. After drying in air for 10 minutes a dry coating weight of about 2.4 $g/m^2$ was obtained. The coating was subjected to IR-laser exposure using an imaging energy of 800 $mJ/cm^2$ at 16 watts. 2,000 impressions of high quality print were obtained when the plate was printed on a Ryobi press.

Example 9

A dispersion was made up in the same way as in Example 6 except that silver behenate was used in place of silver sulfamethoxazole. The dispersion consisted of 10% silver behenate, 2.5% ZnO and 0.35% polyvinyl butyral in ethanol. 1.5 g of the dispersion was mixed with 2 g 7.5% polyacrylic acid, 0.5 g 3% ADS 830A and 1 g 0.03 M Tyzor™ AA-135 using a magnetic stirrer. The mixture was coated using a doctor box onto grained anodized aluminum plates. After drying in air for 10 minutes a coating thickness of 2.5 $g/m^2$ was obtained. The plates were exposed using an 830 nm laser device with an energy of 600 $mJ/cm^2$ at 9 watts. The plate was used to print 3,000 impressions of fair quality.

Example 10

A dispersion was made from silver 2-mercapto-5-amino-1,2,4-thiadiazole (Silver AMT) 9%, ZnO 3%, polyvinyl butyral (Butvar 76) 0.6%, methanol 34% and 1-methoxy-2-propanol 53%. The dispersion was ball milled to obtain a particle size of less than 5 microns. Solution A was made from 7.5% poly(acrylic acid), 50,000 MW, 4% poly(vinyl butyral), 3% IR dye S0094, 0.7% blue dye Neptun Blaubase 627 (or a similar dye), and 86% 1-methoxy-2-propanol. Solution B was made from 10% Tyzor™ AA-75 (75% in isopropanol) and 90% 1-methoxy-2-propanol. The following formula was made up using 2 g silver AMT dispersion, 0.3 g of solution B, 0.5 g of solution A, and 0.7 g of 1-methoxy-2-propanol. The components were mixed by magnetic stirrer, coated onto grained, anodized aluminum sheets, and dried at 105° C. for 3 minutes in a traveling oven (Wisconsin Oven Corp., Model SPC Mini-34/121) to give a dry coating weight of 2.5 grams per square meter. These plates were then subjected to IR-laser exposure using a Creo. Trendsetter platesetter. The imaging energy was 425 $mJ/cm^2$ at 16 watts. The plate was mounted on a Ryobi press and dampened for 10 seconds. 40,000 impressions of good quality prints were obtained.

Example 11

10% Silver toluenesulfonate, 2.5% ZnO and 0.35% polyvinyl butyral and ethanol were mixed. A dispersion of these materials was made by ball-milling the mixture for 15 hours. The following formulation was made up: 2 g silver toluenesulfonate dispersion, 1 g 7.5% polyacrylic acid, 1 g 7.5% methyl vinyl ether-alt-maleic acid copolymer, 0.5 g 3% ADS 830A and 1 g 0.03 M Tyzor™ AA-135. The formula was coated using a doctor box onto grained, anodized aluminum plates. After drying for 10 minutes in air, the coated plate was subjected to IR-laser exposure. The imaging energy used was 600 $mJ/cm^2$ at 9 watts. The plate was then used to print 3,000 impressions with good print quality.

Example 12

A dispersion of sulfadiazine 8.7% and polyvinyl butyral 0.35% in ethanol was made up by milling the materials in a ball mill for 12 hours. The following formula was made up: 3 g sulfadiazine dispersion, 3 g 7.5% polyacrylic acid, 1 g 3% ADS 830A and 3 g 0.03 M Tyzor™ AA-135. The components were mixed in a glass bottle using a magnetic stirrer, and then were coated onto grained, anodized aluminum plates that after drying in air gave a thickness of about 2.5 $g/m^2$. The coating was digitally exposed using an 830 nm IR-laser with an energy of 600 $mJ/cm^2$ with a power of 9 watts. The plate was then used to give 2,000 good quality prints.

Example 13

A dispersion was made up by ball milling 10% ZnO and 0.35% polyvinyl butyral in ethanol. A formulation of the following was made: 1 g ZnO dispersion, 1 g 7.5% polyacrylic acid, 1 g 7.5% methyl vinyl ether-alt-maleic acid copolymer, 0.5 g 3% ADS 830A and 1.5 g 0.03 M Tyzor™ AA-135. The components were mixed in a glass bottle using a magnetic stirrer prior to coating onto anodized aluminum plates. After drying in air, the coated plates were subjected to image-wise 830 nm IR-laser exposure using energy of 600 $mJ/cm^2$ at 9 watts. On printing 3,000 impressions of high quality were reached.

Example 14

A dispersion consisting of 10% $TiO_2$ and 0.35% polyvinyl butyral in ethanol was made by milling in a ball mill for 12 hours. A formula was made up of 1 g $TiO_2$ dispersion, 1 g 7.5% polyacrylic acid, 1 g 7.5% methyl vinyl ether-alt-maleic acid copolymer, 0.5 g 3% ADS 830A and 1.5 g 0.03M Tyzor™ AA-135. The components were mixed in a glass bottle using a magnetic stirrer, and then coated onto grained, anodized aluminum plates. After drying in air a thickness of about 2.7 $g/m^2$ was obtained. The coated plates were digitally exposed using an 830 nm IR-laser. The imaging energy was 600 $mj/cm^2$ using 9 watts of power. The plate was used to print 2,000 good quality impressions on coated paper.

Example 15

The dispersion of the previous example was used to make a formula consisting of 1 g $TiO_2$ dispersion, 2 g 7.5% polyacrylic acid, 0.5 g 3% ADS 830A and 1.5 g 0.03 M Tyzor™ AA-135. The components were mixed in a glass bottle by magnetic stirrer, and then coated using a doctor blade onto grained, anodized aluminum plates. After drying in air for 10 minutes a dry coating weight of 3 $g/m^2$ was produced. The coated plate was image-wise exposed using a Creo. Trendsetter Platesetter with an energy of 600 $mJ/cm^2$ at 9 watts. The plate was mounted on a Ryobi press and 2,000 impressions of high quality were obtained.

Example 16

A solution of 2% Tyzor™ AA135 was added to a solution of 5.4% polyacrylic acid in ethanol containing 0.27% ADS 830 A to make up 3 mols of Ti per 100 mols of carboxyl group. The solution was quickly stirred and cast onto an anodized aluminum plate. After drying the coating using a strong air flow for 5 minutes, the plate was imaged with a laser (830 nm) and used for printing. Once printing was completed, the plate was washed with an aqueous solution of 5% sodium carbonate, rinsed with water, dried, re-coated and after imaging used to print a further image. This process could be repeated a number of times.

Example 17

Solution A was prepared containing 4% polyacrylic acid in ethanol, 0.2% ADS 830AW and titanium(IV) bis(ammonium lactato dihydroxide, (crosslinker I) which comes as a 50% solution in water and it was added to a concentration of 3 mols Ti/100 mols $CO_2H$. A solution B was prepared by adding Tyzor™ TE (80% titanium salt in isopropyl alcohol; crosslinker II) to ethanol in a concentration that would ensure 1.5 mols Ti/100 $CO_2H$ when solutions A and B were mixed in a proportion of 1:1. The two solutions were fed into a spraying gun and mixed in the nozzle just before spraying on an anodized aluminum printing plate. The plate was imaged and then used to print, after which the coating was washed off in 5% aqueous sodium carbonate and the plate re-coated. Crosslinker I was active during laser imaging, while crosslinker II ensures background crosslinking.

Example 18

A mixed solution of polyacrylic acid and poly(vinyl methyl-alt-maleic acid) of MW350K was prepared with a total concentration of 5.4% solids in ethanol and a weight ratio of 1:1 of the two polymers. A solution of the polymethine dye SDA 3984 in ethanol was added to the above polymer solution to have a dye concentration of 0.216%. Then a solution of 2% Tyzor™ AA-75 in ethanol was added to a final concentration of 3% mols Ti per 100 mols carboxyl. The solution was quickly stirred and cast on an aluminum plate. After quick evaporation under a strong airflow, the plate was imaged with laser (830 nm) and used for printing. Once the printing job was complete, the coating on the plate was removed by washing with a solution of 5% sodium carbonate. The substrate was rinsed with water, dried and re-coated. The new coating was used as a printing master. The cycle could be repeated for a number of times.

Example 19

A solution of polyacrylic acid of MW150K was prepared with a total concentration of 5.4% solids in ethanol. A solution of the ADS 830A dye in ethanol was added to the above polymer solution to give a dye concentration of 0.216%. An anodized aluminum surface was primed with a solution of Tyzor™ AA75 to give a thickness of less than 0.5 g/square meter. A solution of 2% Tyzor™ AA-75 in ethanol was mixed in an in-line mixer and then sprayed onto the primed surface of the substrate which was mounted on an SM74 printing press. The coating had a final concentration of 3% mols Ti per 100 mols carboxyl and a coating weight of 2 g/square meter. The coating was dried using a strong flow of air at room temperature. The plate was imaged with a laser (830 nm) and used for printing. Once the printing job completed at 1,000 impressions, the plate was cleaned of ink using a blanket wash. The coating was sprayed with a solution of 5% sodium carbonate, the coating was removed using a pressure washer containing water. The plate substrate was dried and re-coated. A new image was created in the coating and this was used as a printing master 5,000 good impressions were obtained from the printing master. The above cycle could be repeated for a number of times without deterioration in the printing quality.

Example 20

Solution A was prepared containing 4% solids as a 90:10-70:30 mixture of polyacrylic acid and poly(butadiene-co-acrylic acid) (30% solution in water and having a monomer ratio of 1:1). Solution B contained dye, SDA 3984, in a concentration of 0.16% and Tyzor™ TE in ethanol in a concentration that ensured a Ti concentration of 2–3 mols Ti/100 $CO_2H$ groups after mixing solutions A and B in a 1:1 volumetric ratio. The two solutions were mixed in the nozzle of the spraying gun. A plate was coated, imaged and printed for 500 impressions, then washed and re-coated as in the previous example.

Example 21

A dispersion was prepared by mixing 30 g of zinc sulfadiazine, 21 g 5% polyvinyl butyral solution in ethanol, and 234 g of ethanol. This was passed three times thorough a microfluidizer to give a stable white dispersion. A coating solution was prepared by mixing 3.36 g of dispersion with 1.45 g of 7.5% polyacrylic acid, 2.11 g of 1% infrared dye solution (ADS 830A), 1.14 g of ethanol. This was coated on the anodized side of the lithographic printing plate using a knife coater at 3 mils wet. The sample was dried for 2 minutes at 60 C. The resulting printing plate was imaged with a Creo Trendsetter at 11 watts and 600 mJ/$cm^2$. This plate was printed using a Ryobi printing press giving sharp images showing 1–97% dots at 200 lpi. The plate printed 1,000 impressions with no visible signs of wear.

Examples 22–27

Plate Formulations

The procedure used was to make a dispersion of each metal sulfa derivative by taking 15 grams of each, 7.5 grams of ZnO and 10.5 grams of 5% polyvinyl butyral solution in ethanol and 117 grams of ethanol. This was ball milled with glass marble for 18–24 hours to form a stable dispersion. Each dispersion was formulated into a part A of a coating by mixing 16.1 grams of dispersion with 0.8 grams of a 5% acetic acid/water, 5.3 grams of water and 15.7 grams of isopropyl alcohol. The part B resin solution was prepared by using 22.6 grams of 7.5% ethanol solution of polyacrylic acid, 18.3 grams of 2% ethanol solution of infrared absorbing dye 830A (ADS) and 112 grams of ethanol. Just prior to coating, the two solutions were mixed in a one to one ratio, coated on aluminum sheet, and dried with hot 75 degree C. air to give a dry coating weight of 3 grams per square meter.

Imaging and Print Results

The plates were imaged with a Creo Trendsetter platesetter using 830 nm laser diode array run at 12 watts. The best images were achieved at the following energies.

| | | |
|---|---|---|
| Silver sulfadiazine | 1500 mJ/$cm^2$ | Ran very clean. |
| Silver sulfamerazine | 400 | Ran very clean |
| Silver sulfamethazine | 400 | Ran very clean |
| Silver sulfamethoxazole | 300 | Began clean, but ran with slight increasing scum |
| Iron sulfadiazine | 800 | Ran with slight scum |
| Copper sulfadiazine | 500 | Ran very clean |

These were evaluated by running on a Ryobi single color printing press. All demonstrated good hydrophobic/hydrophilic balance with the imaged area taking the ink. All of the plates rolled up within 30 prints and were able print out to 3,000 except the iron sulfadiazine that showed marginal printing performance.

Comparative Example 28

A dispersion was made by taking 15 grams sulfadiazine, 7.5 grams of ZnO and 10.5 grams of 5% polyvinyl butyral solution in ethanol and 117 grams of ethanol. This mixture was ball milled with glass marble for 18–24 hours to form a stable dispersion.

Each dispersion was formulated into part A of a coating by mixing 16.1 grams of dispersion with 0.8 grams of a 5% acetic acid/water, 5.3 grams of water and 15.7 grams of isopropyl alcohol. Part B resin solution was mixed using 22.6 grams of 7.5% ethanol solution of polyacrylic acid, 18.3 grams of 2% ethanol solution of infrared absorbing dye 830A (ADS) and 112 grams of ethanol. Just prior to coating, the two solutions were mixed in a one to one ratio. The resultant solution was coated onto aluminum sheet, and dried with air at 75° C. A dry coating weight of 3 grams/square meter was obtained. The plate was imaged with a Creo Trendsetter platesetter using an 830 nm laser diode device. The plate was imaged using 12 Watts and 1500 mJ/cm squared. This is the same energy as was used for the silver sulfadiazine. An image appeared on the plate during the imaging step but when the plate was mounted on the Ryobi press, there was no differential in oleophilicity between the image and non-image areas. The plate would not take ink.

Example 29

A dispersion was prepared of polyacrylic acid hydroxyethyl acrylate copolymer 95:5, 40%, silver behenate 56% and IR dye ADS 830A 4% in methylethyl ketone to give a solids content of 4%. The mixture was ball-milled using glass marbles overnight. A solution of hexamethylene diisocyanate in methylethyl ketone was added to the dispersion so that equimolar isocyanate function to hydroxyl function was obtained and the mixture was knife-coated onto a grained, anodized aluminum sheet. After the solvent had dried, the coating was imaged using an infrared laser with an energy of 400 mJ at 10 Watts. The coating was not removed using 50 double wipes with fountain solution and 5% isopropanol. An inked image was formed when wiped with lithographic ink. The non-image areas did not take ink.

Example 30

A solution was made from 5% polyvinyl alcohol (Elvanol 52-22) and water. A printing plate precursor as described in Example 10 was overcoated with this solution, and dried at 105° C. for 3 minutes in a traveling oven (Wisconsin Oven Corp., Model SPC Mini-34/121) to give a dry coating weight of 1.3 grams per square meter. The plate was then subjected to IR-laser exposure using the Creo Trendsetter platesetter. The imaging energy was 800 mJ/cm2 at 15 watts. The plate was mounted on a Ryobi press and dampened for 10 seconds. 40,000 impressions of good quality prints were obtained. The overcoat improved the fingerprint or scratch sensitivity of the plate compared to Example 10. The overcoat also had a beneficial impact on plate discoloration and debris trapping.

Example 31

A solution was made from 1% chitosan (Vanson), acetic acid and water. A printing plate precursor as described in Example 10 was overcoated with this solution, and dried at 105° C. for 3 minutes in a traveling oven to give a dry coating weight of 0.6 grams per square meter. The plate was then subjected to IR-laser exposure using the Creo Trendsetter platesetter. The imaging energy was 800 mJ/cm2 at 15 watts. The plate was mounted on a Ryobi press and dampened for 10 seconds. 40,000 impressions of good quality prints were obtained. The overcoat improved the fingerprint or scratch sensitivity of the plate compared to Example 10. The overcoat also had a beneficial impact on plate discoloration.

Example 32

A solution was made from 0.25% polyvinyl alcohol (Elvanol 52-22), 0.05% chitosan (Vanson), 0.91% acetic acid, 0.02% d-glucose and 98.8% water. A printing plate precursor as described in Example 10 was overcoated with this solution, and dried at 105° C. for 3 minutes in a traveling oven to give a dry coating weight of 0.5 grams per square meter. The plate was then subjected to IR-laser exposure using the Creo Trendsetter platesetter. The imaging energy was 800 mJ/cm2 at 15 watts. The plate was mounted on a Ryobi press and dampened for 10 seconds. 40,000 impressions of good quality prints were obtained. The overcoat improved the fingerprint or scratch sensitivity of the plate compared to Example 10. The overcoat also had a beneficial impact on plate discoloration and debris trapping. The overcoat was more easily eluable in aqueous media like the fountain solution in the printing press.

Example 33

A solution was made from 0.25% polyvinyl alcohol (Elvanol 52-22), 0.05% chitosan (Vanson), 0.91% acetic acid, 0.02% d-glucose and 98.8% water. A printing plate precursor as described in Example 10 was overcoated with this solution, and dried at 105° C. for 3 minutes in a traveling oven to give a dry coating weight of 0.25 grams per square meter. The plate was then subjected to IR-laser exposure using the Creo Trendsetter platesetter. The imaging energy was 500 $mJ/cm^2$ at 15 watts. The plate was mounted on a Ryobi press and dampened for 10 seconds. 40,000 impressions of good quality prints were obtained. The overcoat improved the fingerprint or scratch sensitivity of the plate compared to Example 10. The overcoat also had a beneficial impact on plate discoloration and debris trapping. The overcoat was more easily eluable in aqueous media like the fountain solution in the printing press.

Example 34

A solution was made from 0.25% polyvinyl alcohol (Elvanol 52-22), 0.05% chitosan (Vanson), 0.91% acetic acid, 0.02% d-glucose and 98.8% water. A printing plate precursor as described in Example 10 was overcoated with this solution, and dried at 105° C. for 3 minutes in a traveling oven to give a dry coating weight of 0.3 grams per square meter. The plate was then subjected to IR-laser exposure using the Creo Trendsetter platesetter. The imaging energy was 560 $mJ/cm^2$ at 15 watts. The plate was mounted on a Ryobi press and dampened for 10 seconds. 40,000 impressions of good quality prints were obtained. The overcoat improved the fingerprint or scratch sensitivity of the plate compared to Example 10. The overcoat also had a beneficial impact on plate discoloration and debris trapping. The overcoat was more easily eluable in aqueous media like the fountain solution in the printing press.

Example 35

A solution was made from 0.25% polyvinyl alcohol (Elvanol 52-22), 0.05% chitosan (Vanson), 0.91% acetic acid, 0.02% d-glucose, 0.03% IR dye S0094, 0.77% methanol and 98% water. A printing plate precursor as described in Example 10 was overcoated with this solution, and dried at 105° C. for 3 minutes in a traveling oven to give a dry coating weight of 0.3 grams per square meter. The plate was then subjected to IR-laser exposure using the Creo Trendsefter platesetter. The imaging energy was 450 mJ/$cm^2$ at 15 watts. The plate was mounted on a Ryobi press and dampened for 10 seconds. 40,000 impressions of good quality prints were obtained. The overcoat improved the fingerprint or scratch sensitivity of the plate compared to Example 10. The overcoat also had a beneficial impact on plate discoloration and debris trapping. The overcoat is more easily eluable in aqueous media like the fountain solution in the printing press. The exposure speed of the plate was improved compared to Example 34.

What is claimed is:

1. A printing plate precursor comprising a substrate having coated thereon in the following order:

(a) a hydrophilic layer comprising a mixture of a crosslinkable polymer and a thermally active crosslinking metal salt, and (b) an overcoat eluable in aqueous media, the hydrophilic layer capable of becoming less hydrophilic upon exposure to radiation that effects crosslinking in the layer, wherein the overcoat layer comprises an aqueous-soluble organic polymer, chitosan and an infrared-absorbing dye.

2. The printing plate precursor of claim 1, wherein crosslinking reactions of the crosslinkable polymer are independent of crosslinking actions of the thermally active crosslinking metal salt.

3. The printing plate precursor of claim 1, wherein crosslinking reactions of the crosslinkable polymer are interdependent on crosslinking actions of the thermally active crosslinking metal salt.

4. The printing plate precursor of claim 1, wherein the crosslinkable polymer comprises a polymer derived from an ethylenically unsaturated monomer.

5. The printing plate precursor of claim 1, wherein the crosslinkable polymer comprises a polymer derived from at least one ethylenically unsaturated monomer selected from the group consisting of (meth)acrylic acid, butyl (meth) acrylate, cyclohexyl (meth)acrylate, ethylhexyl (meth)acrylate, benzyl (meth)acrylate, furfuryl (meth)acrylate, ethoxyethyl (meth)acrylate, tricyclodecanyloxy (meth)acrylate, nonylphenyloxyethyl (meth)acrylate, hexanediol (meth) acrylate, 1,3-dioxolane (meth)acrylate, hexanediol di(meth) acrylate, butanediol di(meth)acrylate, neopentyl glycol di(meth)acrylate, polyethylene glycol di(meth)acrylate, isobomyl(meth)acrylate, tricyclodecanedimethylol di(meth) acrylate, tripropylene glycol di(meth)acrylate, bisphenol-A di(meth)acrylate, pentaerythritol tri(meth)acrylate, dipentaerythritol hexa(meth)acrylate, dipentaerythritol caprolactone adduct hexa(meth)acrylate, trimethylolpropane tri (meth)acrylate, trimethyloipropane propylene oxide adduct tri(meth)acrylate, polyoxyethylated bisphenol-A di(meth) acrylate, polyester (meth)acrylate, polyurethane (meth)acrylate, and acetoacetoxyethyl (meth)acrylate.

6. The printing plate precursor of claim 1, wherein the crosslinkable polymer comprises at least one of a poly (meth) acrylic acid and a saceharide.

7. The printing plate precursor of claim 1, wherein the crosslinkable polymer comprises at least one of a poly (meth)acrylic acid and chitosan.

8. The printing plate precursor of claim 1, wherein the thermally active crosslinking metal salt is selected from at least one of the following groups: metal salts of sulfamide, sulfanylamide, acetosulfamine, sulfathiazole, sulfadiazine, sulfamerazine, sulfamethoxazole, sulfamethazine, sulfaisoxazole, homosulfamine, sulfisomidine, sulfaguanidine, sulfamethizole, sulfapyridine, phthalisosulfathiazole, succinylsulfathiazole, amino-mercapto-thiadiazole, benzothiazole, benzimidazole, fatty acids, and complexed metal salts.

9. The printing plate precursor of claim 1, wherein the overcoat layer comprises at least one saccharide.

10. The printing plate precursor of claim 1, wherein the infrared-absorbing dye is an aqueous-soluble infrared-absorbing dye.

11. The printing plate precursor of claim 1, wherein the substrate is a flat sheet, a sleeve or a printing cylinder.

12. The printing plate precursor of claim 1, wherein the crosslinkable polymer is selected from at least one of the following classes:

(a) thermosetting phenolic resins, (b) thermoset polyimide resins, (c) thermoset epoxides or epoxy resins, (d) thermoset polyester resins, (e) thermoset polyurethanes, (f) thermoset urea resins, (g) thermoset melamine resins, (h) thermoset furan resins, and (i) thermoset vinyl ester resins.

13. A method of imaging comprising the steps of:

(a) providing a printing plate precursor comprising a substrate having coated thereon:

(i) a hydrophilic layer comprising a mixture of a crosslinkable polymer and a thermally active crosslinking metal salt, the hydrophilic layer capable of becoming less hydrophilic upon exposure to radiation that effects crosslinking in the layer; and (ii) an overcoat layer, the overcoat layer comprising an aqueous-soluble organic polymer, chitosan and an infrared-absorbing dye and the overcoat layer eluable in aqueous media; and (b) imagewise exposing said printing plate precursor to provide exposed and unexposed areas in the hydrophilic layer of said printing plate precursor, whereby the exposed areas are rendered less hydrophilic than the unexposed areas by heat provided by the imagewise exposing.

14. The method of claim 13, wherein said imagewise exposing is carried out using one of an infrared radiation emitting laser and an infrared radiation emitting laser array.

15. A method of making a printing plate comprising the steps of:

(a) providing a printing plate precursor, the precursor comprising a substrate having coated thereon a heat-sensitive composition comprising:

(i) a crosslinkable hydrophilic polymer;

(ii) a thermally active crosslinking metal salt;

(iii) an infrared radiation-sensitive dye that is soluble in a solvent, the solvent being at least one of water and a water-miscible organic solvent, the infrared-sensitive dye having maximum absorption at wavelengths greater than 700 nm as measured in the solvent;

the printing plate precursor having disposed over said heat-sensitive composition, an overcoat layer comprising an aqueous-soluble organic polymer and chitosan, the overcoat layer being eluable in aqueous solvent, (b) imagewise exposing said printing plate precursor to provide exposed and unexposed areas of the heat-sensitive composition, whereby the exposed areas are rendered less hydrophilic than the unexposed areas by heat provided by the imagewise exposing; and (c) bringing the printing plate precursor into contact with at least one of lithographic printing ink and fountain solution.

16. The method of claim 15 wherein bringing the printing plate precursor into contact is performed on-press.

* * * * *